United States Patent
Abotabl et al.

(10) Patent No.: US 10,644,835 B1
(45) Date of Patent: May 5, 2020

(54) SYSTEM AND METHOD FOR INTERLEAVING DISTRIBUTED CRC IN POLAR CODES FOR EARLY TERMINATION

(71) Applicant: Samsung Electronics Co., Ltd., Suwon-si, Gyeonggi-do (KR)

(72) Inventors: Ahmed A. Abotabl, San Diego, CA (US); Jung Hyun Bae, San Diego, CA (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/238,152

(22) Filed: Jan. 2, 2019

Related U.S. Application Data

(60) Provisional application No. 62/744,992, filed on Oct. 12, 2018.

(51) Int. Cl.
  *H04L 1/00* (2006.01)
  *H04B 17/336* (2015.01)
  *H03M 13/13* (2006.01)

(52) U.S. Cl.
  CPC .......... *H04L 1/0063* (2013.01); *H03M 13/13* (2013.01); *H04B 17/336* (2015.01); *H04L 1/0071* (2013.01)

(58) Field of Classification Search
  CPC ... H04L 1/0063; H04L 1/0071; H04B 17/336; H03M 13/13
  See application file for complete search history.

(56) References Cited

U.S. PATENT DOCUMENTS

| | | |
|---|---|---|
| 2003/0133497 A1 | 7/2003 | Kinjo et al. |
| 2010/0107033 A1 | 4/2010 | Kuri et al. |
| 2014/0164876 A1* | 6/2014 | Gasanov ............ G06F 11/1048 714/769 |
| 2016/0241357 A1 | 8/2016 | Jeong et al. |
| 2018/0076929 A1 | 3/2018 | Zhang et al. |
| 2018/0150351 A1* | 5/2018 | Li ...................... G06F 12/0806 |
| 2018/0226999 A1 | 8/2018 | Wang et al. |

FOREIGN PATENT DOCUMENTS

WO 2018144560 A1 9/2018

* cited by examiner

*Primary Examiner* — Kashif Siddiqui
(74) *Attorney, Agent, or Firm* — Innovation Counsel LLP

(57) ABSTRACT

An apparatus includes: a cyclic redundancy check (CRC) encoder configured to receive k information bits and generate p parity bits corresponding to the k information bits, k and p being positive integers; and an interleaver configured to output an interleaved bit sequence, in which the k information bits are interleaved with the p parity bits. The interleaved bit sequence includes a first subset of the k information bits appended with a first parity bit of the p parity bits and a second subset of the k information bits appended with a second parity bit of the p parity bits. The first subset of the k information bits is located earlier than the second subset of the k information bits in the interleaved bit sequence. The second subset of the k information bits and all of preceding information bits in the interleaved bit sequence including the first subset of the k information bits deterministically correlate the second parity bit of the p parity bits.

20 Claims, 11 Drawing Sheets

SYSTEM AND METHOD FOR INTERLEAVING DISTRIBUTED CRC IN POLAR CODES FOR EARLY TERMINATION

CROSS-REFERENCE TO RELATED APPLICATION(S)

This application claims the benefits of and priority to U.S. Provisional Patent Application Ser. No. 62/744,992 filed Oct. 12, 2018, the disclosure of which is incorporated herein by reference in its entirety.

TECHNICAL FIELD

The present disclosure relates generally to an encoding schemes for wireless data communication, more particularly, to a system and method for interleaving distributed cyclic redundancy check (CRC) in polar codes for early termination.

BACKGROUND

Polar codes have been adopted as a channel coding scheme for the control channel of the 3rd Generation Partnership Project (3GPP) New Radio (NR) standards. In a downlink control channel referred to as Physical Downlink Control Channel (PDCCH) in the NR standards, a user equipment (UE) is configured with a time and frequency range (also referred to as search space) in which its valid control information may exist. The user equipment may perform decoding of received downlink signals within the search space to identify valid information, and in the process of decoding, errors may occur. These decoding errors waste the system resources and processing power, and hence, any reduction in the decoding processing can be of a great advantage.

The NR standards introduced distributed cyclic redundancy check (D-CRC) codes that exploits successive nature of a typical polar codes decoding scheme. Each D-CRC parity bit is used to validate a subset of information bits once they are decoded. If the D-CRC parity bit approves the corresponding information bits, the decoding process continues while if the D-CRC parity disapproves the corresponding information bits, the decoding process can be terminated early since a decoding failure is unavoidable in this case. Such decoding termination prior to decoding the entire information bits is referred to as early termination, and the order of the D-CRC bits as well as the corresponding set of information bits in a transmitted sequence of bits makes a difference in the early termination performance.

SUMMARY

According to one embodiment, an apparatus includes: a cyclic redundancy check (CRC) encoder configured to receive k information bits and generate p parity bits corresponding to the k information bits, k and p being positive integers; and an interleaver configured to output an interleaved bit sequence, in which the k information bits are interleaved with the p parity bits. The interleaved bit sequence includes a first subset of the k information bits appended with a first parity bit of the p parity bits and a second subset of the k information bits appended with a second parity bit of the p parity bits. The first subset of the k information bits is located earlier than the second subset of the k information bits in the interleaved bit sequence. The second subset of the k information bits and all of preceding information bits in the interleaved bit sequence including the first subset of the k information bits deterministically correlate the second parity bit of the p parity bits.

According to another embodiment, an apparatus includes: an decoder configured to decode an interleaved bit sequence. The interleaved bit sequence includes a first subset of k information bits appended with a first parity bit of p parity bits and a second subset of the k information bits appended with a second parity bit of the p parity bits. The first subset of the k information bits is located earlier than the second subset of the k information bits in the interleaved bit sequence. The second subset of the k information bits and all of preceding information bits in the interleaved bit sequence including the first subset of the k information bits deterministically correlate the second parity bit of the p parity bits. The decoder is configured to calculate a parity bit corresponding to the first subset of the k information bits and determine an occurrence of a CRC error by comparing the parity bit with the first parity bit of the p parity bits included in the interleaved bit sequence. The decoder is further configured to terminate decoding of the interleave bit sequence when the CRC error is detected.

According to another embodiment, a method includes: receiving k information bits, k being a positive integer; generating p parity bits corresponding to the k information bits, p being a positive integer; interleaving the p parity bits in the k information bits to generate an interleaved bit sequence; and transmitting the interleaved bit sequence to a user equipment over a wireless data communication channel. The interleaved bit sequence includes a first subset of the k information bits appended with a first parity bit of the p parity bits and a second subset of the k information bits appended with a second parity bit of the p parity bits. The first subset of the k information bits is located earlier than the second subset of the k information bits in the interleaved bit sequence. The second subset of the k information bits and all of preceding information bits in the interleaved bit sequence including the first subset of the k information bits deterministically correlate the second parity bit of the p parity bits.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

Figure 1:
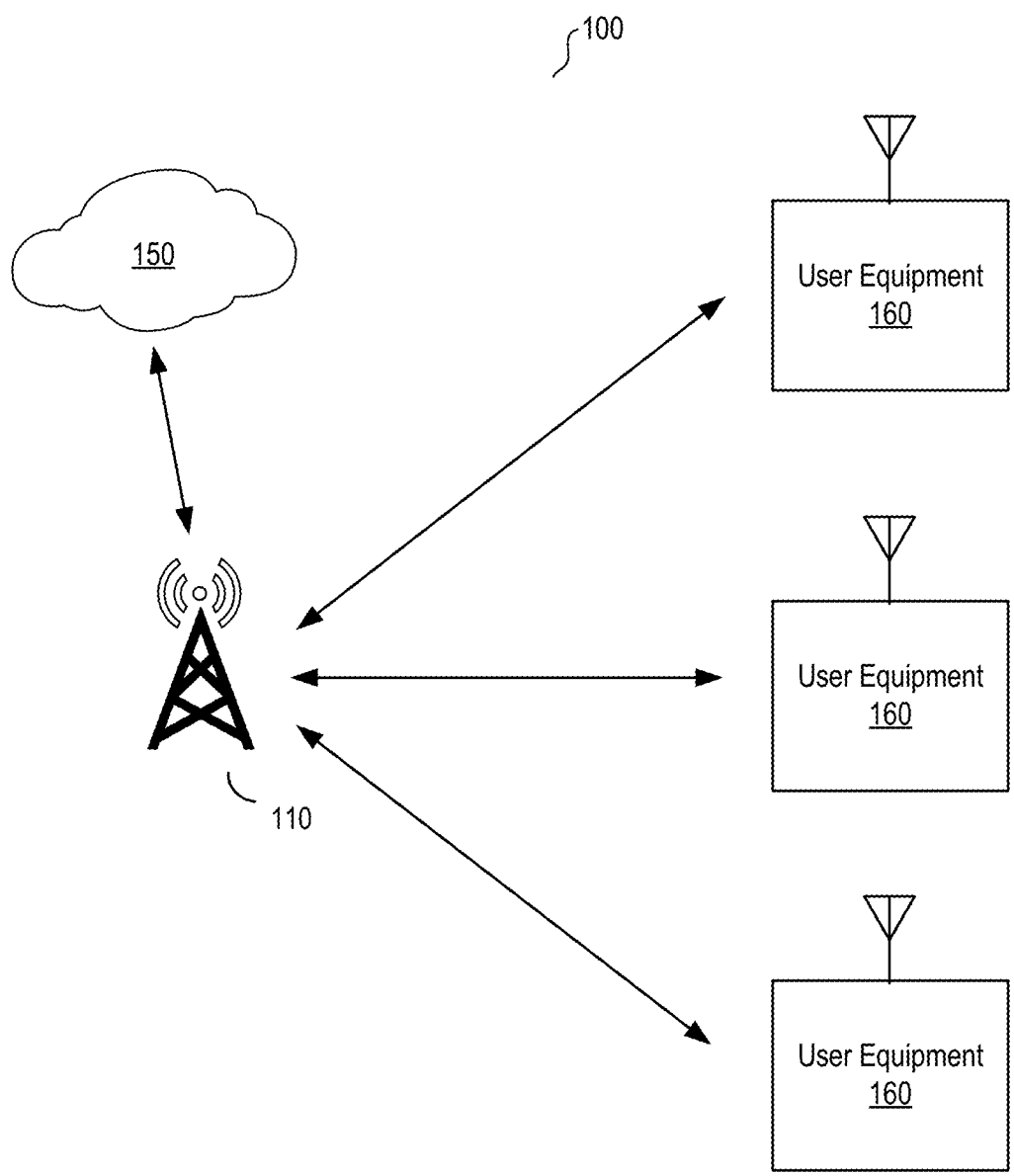
FIG. 1 is a system diagram illustrating an environment in which the present wireless communication system and method can be applied according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a system and method for interleaving distributed cyclic redundancy check (CRC) in polar codes for early termination. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure describes a system and method for interleaving distributed cyclic redundancy check (D-CRC) in polar codes to enable early termination when an error is detected in the D-CRC. According to one embodiment, the present system and method is directed towards ordering of information bits and the D-CRC bits that is determined by an interleaving pattern such that a high early termination gain can be obtained. For example, the present system and method can achieve higher early termination gain of polar codes compared to NR interleaving scheme under successive cancellation (SC) and successive cancellation list (SCL) decoding schemes.

In particular, embodiments of the present system and method includes applying a greedy algorithm to ensure that parity bits appear as early as possible in an input sequence to a polar encoder given that all the corresponding information bits of a given parity bit have to appear in the sequence before the parity bit. Herein, the term "greedy" refers to an interleaver's capability of identifying the smallest subset of information bits that can calculate a parity bit and interleave the parity bit as early as possible in a sequence of information bits. Since a decoder works in a successive manner, the validity of the parity bits is checked earlier in a decoding process than in conventional D-CRC schemes, and hence, the present system and method can achieve a higher early termination gain.

Figure 3:
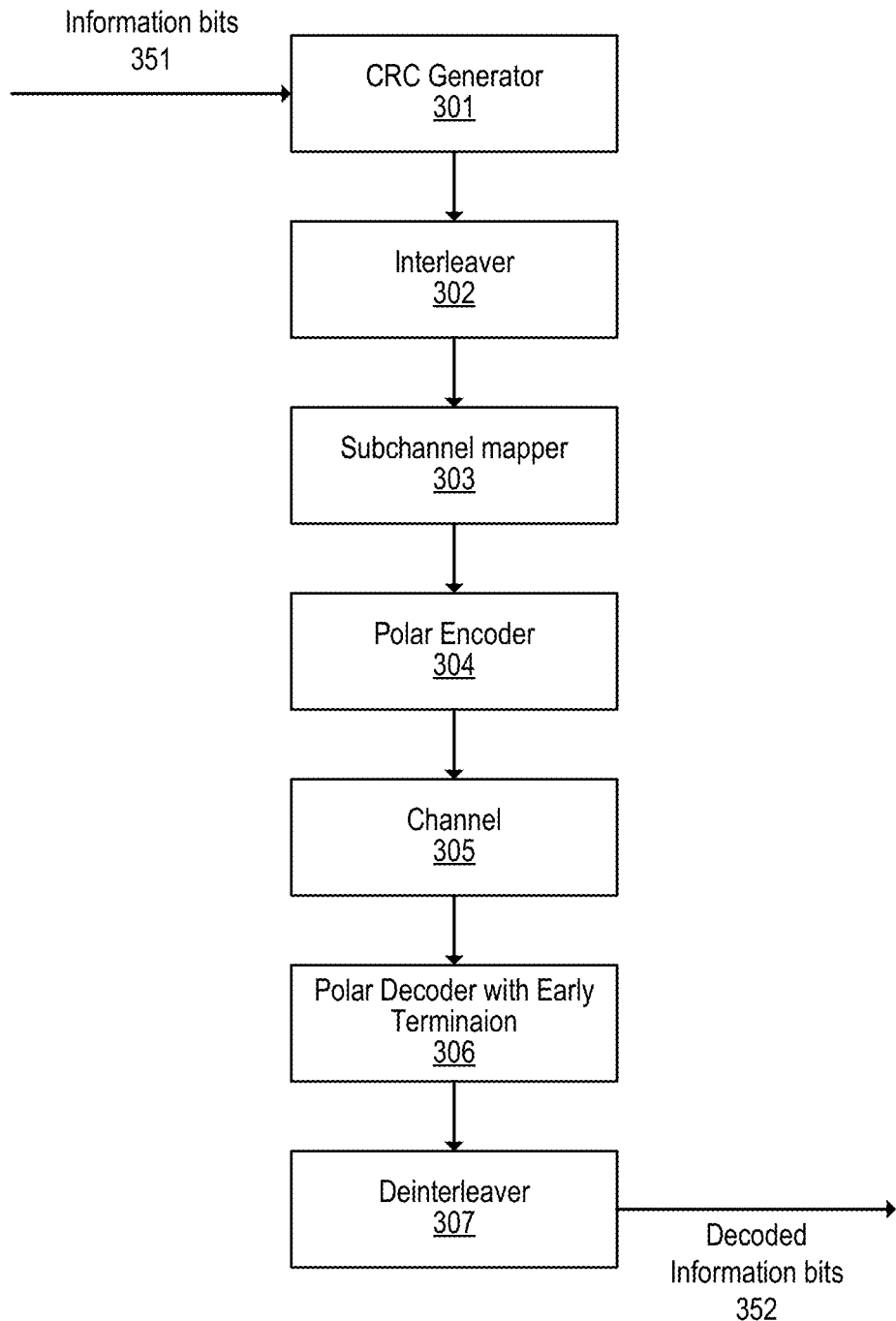
FIG. 3 illustrates a block diagram of an example distributed CRC encoding and decoding scheme, according to one embodiment.

FIG. 1 is a system diagram illustrating an environment in which the present wireless communication system and method can be applied according to one embodiment. A wireless communication system 100 includes a plurality of user equipment 160 that may communicate with one or more base stations 110. In the present example, only one base station 110 is shown; however, it is understood that each user equipment 160 may communicate two or more base stations 110 without deviating from the scope of the present disclosure. The user equipment 160 may request a service (e.g., a voice talk, a text message, an uplink request to an Internet Service Provider (ISP)) via the base station 110 to another entity in the wireless communication system 100 that may exist over a network 150 to execute an application, perform an operation, or the like. Referring to FIG. 3, an interleaver (e.g., 302) can be implemented as a part of a transmitter of either the base station 110 or the user equipment 160, and a corresponding deinterleaver (e.g., 307) can be implemented as a part of a receiver of either the base station 110 or the user equipment 160. For example, according to the NR standard, polar codes are used for transmitting signals from the base station 110 to the user equipment 160, and hence, the interleaver is implemented in the transmitter of the base station 110 and the de-interleaver is implemented in the receiver of the user equipment 160.

The user equipment 160 may communicate with the base station 110 over a cellular network such as a Long Term Evolution (LTE) network, a 5G network, or other next generation networks. In some embodiments, the user equipment 160 may communicate with the base station 110 over a Wireless Local Area Network (WLAN) connection such as a Wireless-Fidelity (Wi-Fi) connection. In this case, the base station 110 may be a wireless station such as a route or an access point compatible with IEEE 802.11 standards. Examples of the user equipment 160 include, but are not limited to, a mobile phone, a smartphone, a mobile computer, a laptop computer, a notebook computer, a tablet computer, a handheld computer, a handheld electronic device, a storage device, a Personal Digital Assistant (PDA) device, a consumer device, a vehicular device, a Global Positioning System (GPS) device, a gaming device, and a media player.

Figure 2:
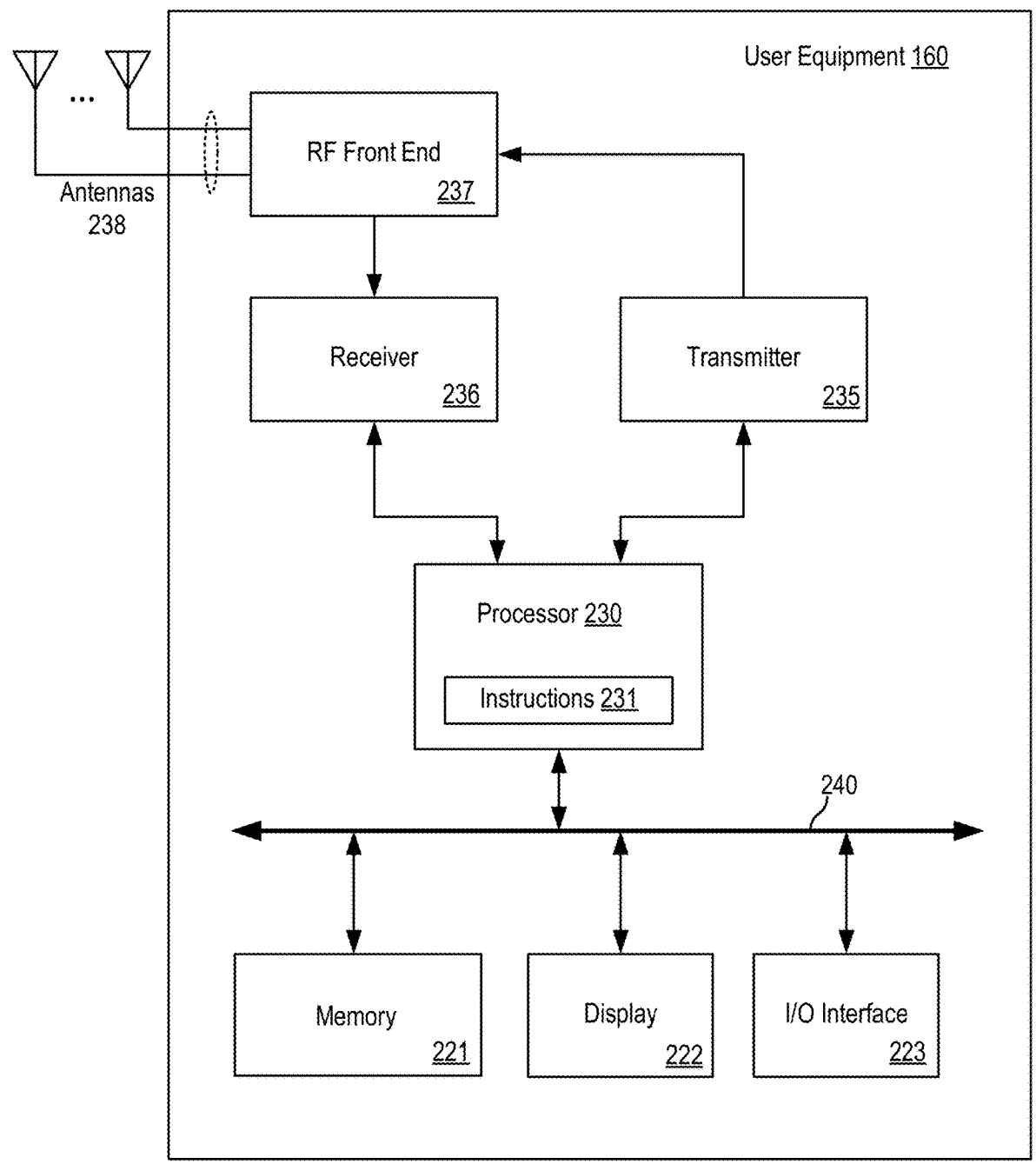
FIG. 2 illustrates a schematic diagram of a present data communication system, according to one embodiment.

FIG. 2 is a schematic diagram of a user equipment, according to one embodiment. It is understood that FIG. 2 is only representative of a generic user equipment and that in actual implementations, the user equipment 160 may use various configurations and include other elements not shown in FIG. 2. In a cellular network system, the user equipment 160 may be a mobile phone, a smartphone, a tablet computer, a smart watch, a vehicle, or the like. In a WLAN system, the user equipment 160 may be configured as an access point or a wireless station.

The user equipment 160 may include one or more antennas 238 that are coupled to a radio frequency (RF) front end 237. A receiver 235 and a transmitter 236 are coupled to the RF front end 237 and receive signals from and transmit signals to the antennas 238. The user equipment 160 further includes a processor 230 that executes instructions 231 to perform various operations for receiving and transmitting data packets to and from a base station or any other wireless communication devices. The processor 230 may be in communication with a system bus 240. Through the system bus 240, the processor 230 can communicate with one or more system components of the user equipment 160. For example, the user equipment 160 may include a memory 221 for storing the instructions 231 and other data, a display 222 for providing a display to a user, and an I/O interface 223 for interfacing with the user or for providing a status of the user equipment 160 to the user.

Figure 4:
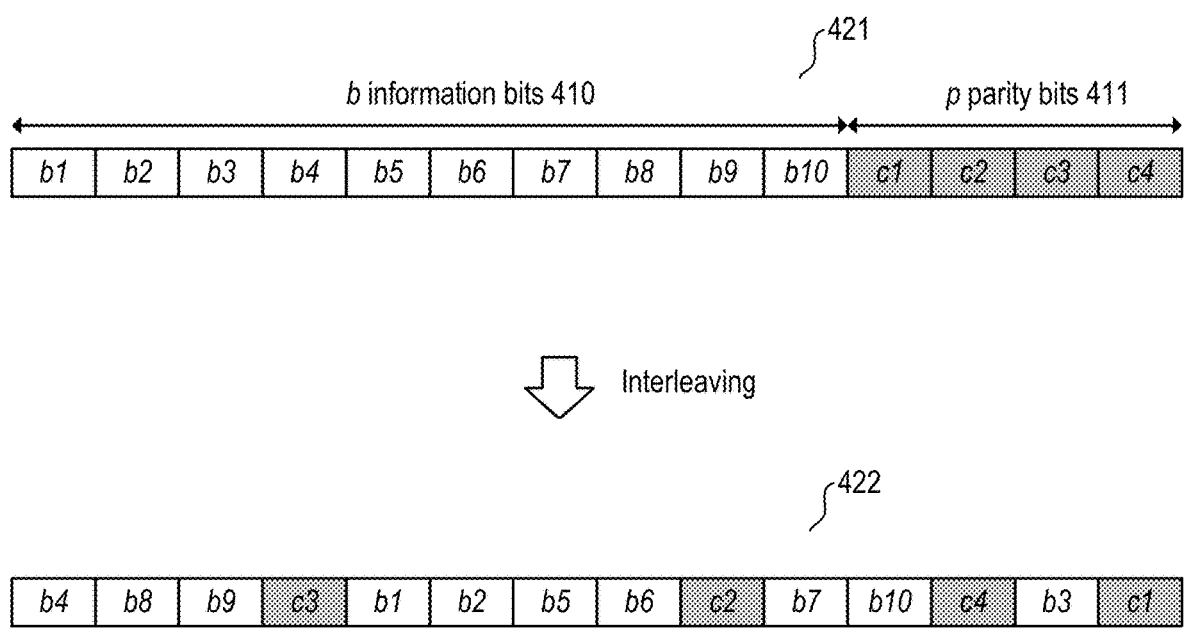
FIG. 4 illustrates an example of a CRC interleaving scheme, according to one embodiment.

FIG. 3 illustrates a block diagram of an example distributed CRC encoding and decoding scheme, according to one embodiment. FIG. 4 illustrates an example of a CRC interleaving scheme, according to one embodiment. It is noted that the block diagram shown in FIG. 3 and the CRC interleaving scheme shown in FIG. 4 are only examples, and it is understood that the present system and method is not limited to these particular implementations.

As a part of a transmitter of either the base station 110 or the user equipment 160 (e.g., the base station 110 in the NR standard) of FIG. 1, information bits 351 are received at a CRC generator 301, and the CRC generator 301 generates a CRC corresponding to the received information bits 351. An interleaver 302 interleaves the CRC corresponding to the information bits 351 into the information bits 351.

Referring to FIG. 4, the CRC generator 301 receives b information bits 410 (e.g., b1 to b10) and attaches a CRC of p parity bits 411 at the end. In the present example, b is 10, and p is 4. It is understood that these numbers are only examples, and any number of information bits may be received, and any number of parity bits may be generated by the CRC generator 301 without deviating from the scope of the present disclosure. The b information bits 410 attached with the p parity bits 411 are collectively referred to as a bit sequence 421. The interleaver 302 interleaves each parity bits of the p parity bits 411 (e.g., c1, c2, c3, and c4) within the b information bits 410 to generate an interleaved bit sequence 422.

A subchannel mapper 303, which is a part of the transmitter of the base station 110 of FIG. 1, maps the interleaver output bits to proper locations of the inputs of the polar encoder, and a polar encoder 304 encodes the interleaved bit sequence 422 with a polar encoding scheme. It is understood that various other encoding schemes may be used to encode the data without deviating from the scope of the present disclosure.

The interleaved, encoded, and mapped data packet including the information bits 351 are wirelessly transmitted to a receiver over a radio signal. The receiver may include a polar decoder 306 with an early termination capability and a deinterleaver 307. If the polar decoder 306 detects no CRC error, the polar decoder 161 decodes the received data packet, and the deinterleaver 307 deinterleaves the decoded data packet to reconstruct the information bits 352. The information bits 352 is identical to the information bits 351 that are transmitted over the channel 305 as being encoded and interleaved.

According to one embodiment, the polar encoder 304 and decoder may be distributed between a user equipment and a base station in a wireless communication system. In the case of a downlink channel, the CRC generator 301, the interleaver 32, and the subchannel mapper 303 and the polar encoder 304 may be implemented in a transmitter such as a base station whereas the polar decoder 306 and the deinterleaver 307 may be implemented on a receiver such as a user equipment. If the user equipment is configured to transmit encoded data packets to the base station, the user equipment may further include the CRC generator 301, the interleaver 302, and the subchannel mapper 303 and the polar encoder 304 in addition to the polar decoder 306 and the deinterleaver 307.

According to some embodiments, the distributed CRC encoder and decoder explained with reference to FIGS. 3 and 4 may be partly or entirely implemented in the base station 110 and/or the user equipment 160 in various forms and configurations, for example, software, firmware, or a dedicated hardware (e.g., a system-on-chip (SOC)), or any combination thereof. For example, according to the NR standard, the distributed CRC encoder is implemented in a transmitter of the base station 110, and the decoder is implemented in a receiver of the user equipment 160. However, it is noted that the present system and method is not limited thereto and can be applied to any system that deploys polar codes with CRC without deviating from the scope of the present disclosure.

The CRC generator 301 may generate the p parity bits 411 or a CRC (p is an integer, for example, p=24) corresponding to the b information bits 410 according to a CRC code. In one embodiment, the CRC code may be defined by a CRC generator polynomial. In the exemplary case where p=24, the CRC generator polynomial may be expressed by:

$$g(x) = x^{24} + x^{23} + x^{21} + x^{20} + x^{17} + x^{15} + x^{13} + x^{12} + x^8 + x^4 + x^2 + x + 1, \quad \text{(Eq. 1)}$$

The CRC generator polynomial governs the dependency of the p parity bits 411 on the information bits 410. Since each parity bit of the p parity bits 411 depends on a subset of the b information bits 410, the interleaver 302 ensures that a particular parity bit of the p parity bits 411 does not appear in the sequence of bits in the interleaved bit sequence 422 until all the corresponding information bits appear. On the receiver, the polar decoder generates an estimate to the information bits and the CRC bits. Consequently, a CRC check is performed by generating the actual CRC of the estimated information bits, and if it matches the estimated CRC bits, the decoder declares success. In some embodiments, the polar decoder and CRC check can be split into two operations. Under the SCL decoding scheme, CRC check may be a part of the decoding operation since the same CRC code is used to choose one of the candidate generated by the list decoder.

Referring to FIG. 3, the polar decoder 306 attempts to recover the information bits by decoding the received data packet in a successive manner from the left (earliest bits) to the right (latest bits) in the order they are received. For example, the polar decoder 306 calculates a parity bit corresponding to the first set of information bits (b4, b8, b9) included the interleaved bit sequence 422 and compares the calculated parity bit with the parity bit c3 that is decoded earliest in the interleaved bit sequence 422. If the calculated parity bit and the parity bit c3 matches, there is no error in the received data packet, and the polar decoder 306 continues to compare a calculated parity bit for the remaining parity bits in the interleaved bit sequence 422 in a successive manner. If the calculated parity bit and the parity bit c3 mismatches, the polar decoder 306 stops decoding the rest of the bits of the interleaved bit sequence 422 and terminates the decoding process. Until an error occurs, the process repeats for the remaining bits of the interleaved bit sequence 422.

Since each parity bit appears in the sequence of decoded information and parity bits after all the corresponding information bits appear, the validity of a particular parity bit can be checked once polar decoder decodes the received bits and checks them against the parity bits that are calculated by the corresponding information bits. If a certain parity bit is not valid, the polar decoder 306 can terminate the decoding process early without decoding the rest of the bits in the interleaved bit sequence 422 because the CRC error cannot be fixed by decoding the rest of the bits.

The interleaver 302 locates one or more parity bits and places them as early as possible in the input sequence to the encoder. This operation is repeated in a greedy manner in that the smallest subset of information bits that can calculate a parity bit is identified and the pair of the smallest set of information bits and the corresponding parity bit is interleaved and placed at the sequence in the interleaved data packet as early as possible.

According to one embodiment, the interleaver 302 defines an interleaving pattern by identifying a subset of the received information bits associated with a particular parity bit included in a sequence of interleaved bit sequence 422. For example, the information bits are arranged in an array of [b1 b2 ... bk], where k is the number of information bits. The interleaver 301 further calculates the parity bits [c1 ... cp] (p is the number of parity bits) corresponding to the array of information bits [b1 b2 ... bk]. The data packet prior to interleaving the parity bits 411 has an array of [b1 b2 ... bk c1 ... cp].

For example, the b information bits 410 includes 10 (b=10) information bits labelled as b1, b2, b3, b4, b5, b6, b7, b8, b9, and b10. The information bits 410 are fed to a CRC generator that generates the parity bits 411 corresponding to the information bits 410 according the CRC code. As discussed above, an example of the CRC code is the CRC generator polynomial of Eq. 1. Suppose that the parity bits 411 that the CRC generator include 4 parity bits c1, c2, c3, and c4 (p=4). It is noted that the relationship between the parity bits and the information bits are determined by the CRC generator polynomial. Based on the CRC code of the CRC generator polynomial, the number of parity bits 411 may vary for the same number of information bits 410.

As a comparative example, prior to interleaving the parity bits 411, the input sequence to the polar encoder corresponds to the bit sequence 421 including a sequence of [b1 b2 b3 b4 b5 b6 b7 b8 b9 b10 c1 c2 c3 c4]. It is noted that checking the validity of a CRC parity bit in the parity bits 411 can be performed only after decoding the parity bit itself as well as the information bits that correspond to the parity bit.

In the present example, suppose that each of the parity bits c1, c2, c3, and c4 relies on a subset of the information bits 410 as follows:
c1=f(b1, b3, b4, b5, b7, b8, b10),
c2=f(b1, b2, b5, b6),
c3=f(b4, b8, b9), and
c4=f(b1, b5, b7, b8, b9, b10).

As a comparative example, an interleaver according to the NR standard specification interleaves the information bits 410 as well as the parity bits 411 to produce a sequence of [b1 b3 b4 b5 b7 b8 b10 c1 b2 b6 c2 b9 c3 c4]. In other words, the information bits b1, b3, b4, b5, b7, b8, and b10 that are related to the parity bit c1 are presented first in the sequence followed by the parity bit c1, the rest of the information bits b2 and b6 related to c2 followed by the parity bit c2, the rest of the information bit b9 related to c3 followed by the parity bit c3, and the rest of the information bits (none in this example) related to c4 followed by the parity bit c4.

According to one embodiment, the interleaver 302 produces a sequence of [b4 b8 b9 c3 b1 b2 b5 b6 c2 b7 b10 c4 b3 c1]. In other words, the interleaver 302 produces a sequence that includes the smallest number of information bits (i.e., 3 for the case of the parity bit c3) that contributes to the parity bit c3 is presented first in the sequence followed by the next large number of information bits (i.e., 4 for the case of the parity bit c2) that contributes to the parity bit c2 is presented in the sequence followed by the corresponding parity bit c2, further followed by the next large number of information bits (i.e., 6 for the case of the parity bit c4) that contributes to the parity bit c4 is presented in the sequence followed by the corresponding parity bit c4, and finally followed by the largest number of information bits (i.e., 7 for the case of the parity bit c1) that contributes to the parity bit c1 is presented in the sequence followed by the corresponding parity bit c1. For a large number of parity bits, the process is repeated until the end of the sequence in the order of the number of information bits that corresponds to a particular parity bit of the CRC.

In the previous sequence of the NR standard interleaving scheme, a polar decoder attempts the decoding of the sequence from the left to the right, therefore the first decoding failure/passing the check can only be done after decoding the first parity bit c1 that is located farther toward the end of the sequence compared to the present interleaving scheme. If the CRC check results in a failure, the NR standard interleaving scheme can achieve little or no savings in computations. A comparison between the NR interleaving scheme and the present interleaving scheme shows that the earliest early termination possible in the case of the NR interleaving scheme is after decoding the parity bit c1 that is the 8th bit in the sequence while the earliest early termination possible according to the present interleaving scheme can occur after the decoding of the parity bit c3 that is the 4th bit in the sequence. If a CRC error is detected regarding the parity bit c3, the polar decoder 306 can early terminate the decoding process of the remaining bits of the sequence.

Generalizing the present interleaving scheme, for each parity bit $c_i$ (i being an integer, i=1 to p) within the parity bits 411 of the CRC, the interleaver 302 checks the information bits in a set Si that contains a total number of |Si| information bits as follows:

$$j1 = \arg\min_i |Si|, D_1 = S_{j1},$$

$$j2 = \arg\min_{i \neq j1} |S_i - S_{j1}|, D_2 = S_{j2} - S_{j1},$$

$$jr = \arg\min_{i \neq j1, j2, \ldots, j(r-1)} |S_i - U_{l=1}^{r-1} S_{jl}|, D_r = S_{jr} - U_{l=1}^{r-1} S_{jl}, \quad \text{(Eq. 2)}$$

The output of the interleaver 302 can be expressed as:

$$[D_1 c_{j1} D_2 c_{j2} \ldots D_p c_{jp}],$$

where the parity bit or the group of parity bits $c_{ji}$ (i=1 to p) is interleaved as immediately following the subset of information bits Di. The subset of information bits Di and all of the preceding subset of information bits $D_1$ to $D_{i-1}$ (i≥2) can deterministically correlate the parity bit of the group of parity bits $c_{ji}$. For example, the subset of information bits $D_1$ to $D_2$ ($S_2 = D_1 + D_2$) can deterministically correlate the parity bit $c_{j2}$, and the subset of information bits $D_1$ to $D_3$ ($S_3 = D_1 + D_2 + D_3$) can deterministically correlate the parity bit $c_{j3}$, and so on.

According to some embodiments, the interleaver 302 generates an interleaving pattern for a given value of k information bits (theoretically k being equal to or greater than 1 and equal to or smaller than the total number of information bits) and the CRC polynomial with p parity bits. The given value of information bits k takes a certain range of bits while the CRC polynomial and the number of parity bits may be predetermined and fixed based on the CRC code being used. When the value of k changes, the interleaver 302 may use a dedicated interleaving pattern for each value of k. However, use of dedicated interleaving pattern for each number of information bits k may not be practically attractive. Although the interleaver 302 can apply an interleaving pattern for each value of k, the interleaver 302 may assume that one or multiple values of k are determined beforehand for the sake of practicality.

The interleaver 302 can determine one or multiple values of k corresponding to a particular parity bit in various ways. For example, the interleaver 302 can consider all possible values of k or a value less than all possible values of k (e.g., 1 to 140) to speed up the interleaving operation. It is empirically observed that the sequence $j_1, j_2, \ldots, j_p$ is invariant in batches implying that it is invariant in certain intervals ($k_i \leq k \leq k_{i+1}$). It is also observed that within one batch, Sj for a smaller value of k is a subset of Sj of a larger value of k.

According to one embodiment, for a given range of k such that $k_i \leq k \leq k_{i+1}$, the interleaver 302 can be designed for the upper limit $k_{i+1}$ of the given range and used for all values of k in the same range $k_i \leq k \leq k_{i+1}$. When the interleaver 302 that is designed for $k_{i+1}$ is used for any value of k in the range $k_i \leq k \leq k_{i+1}$, $k_{i+1} - k$ null bits can appended to the sequence of information bits and are removed after the interleaving operation.

In another embodiment, the interleaver 302 chooses a single value of k to determine an interleaving pattern. The single value of k can be chosen in several ways, for example, the maximum value of k. For example, according to the specification #38.212 of the 3GPP NR standards entitled Multiplexing and Channel Coding, the maximum value of k is 140.

Figure 5A:
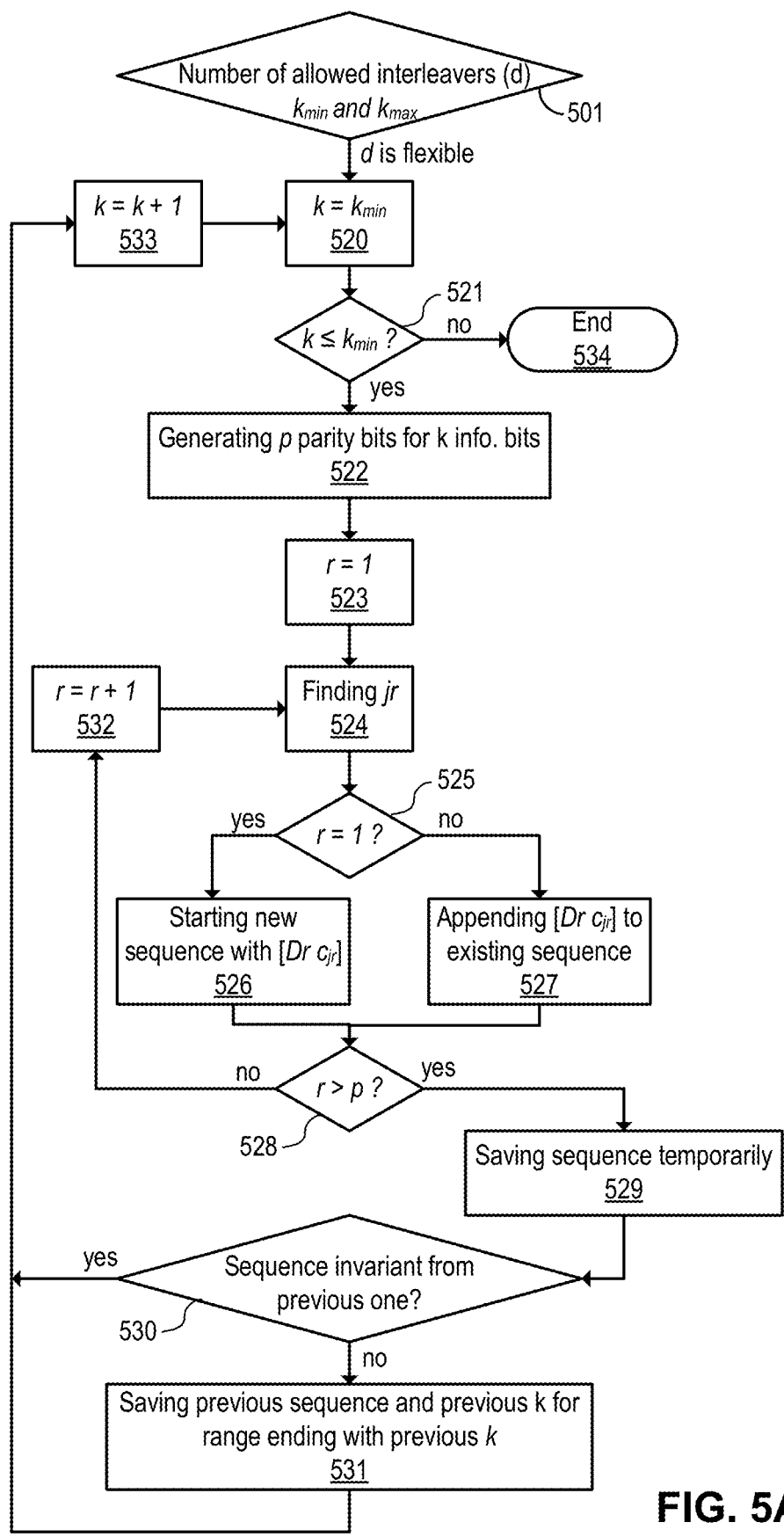
FIG. 5A shows an example interleaving pattern for cases in which d is flexible according to one embodiment.
Figure 5B:
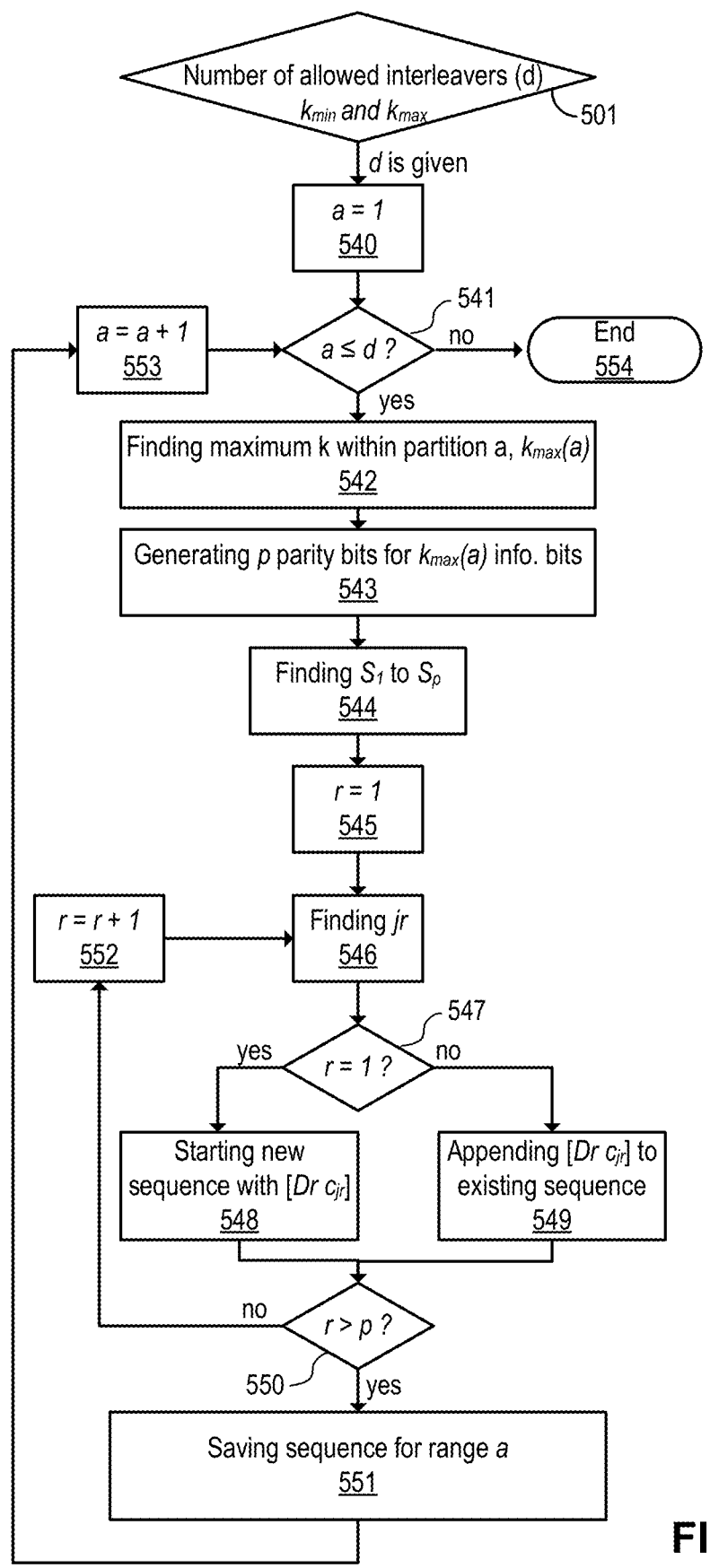
FIG. 5B shows an example interleaving pattern for cases in which d is given according to one embodiment.

FIGS. 5A and 5B are flowcharts for determining an interleaving pattern according to some embodiments. FIG. 5A shows an example interleaving pattern for cases in which the number d of allowed interleaver is flexible whereas FIG. 5B shows an example interleaving pattern for cases in which d is given. The number d of allowed interleaver is between the minimum value $k_{min}$ and the maximum value $k_{max}$.

Referring to FIG. 5A, the process starts by investigating whether the number d of allowed number of interleavers is flexible (at 501). The number of information bits k is initially set to the minimum value $k_{min}$ (at 520) and proceed to the next step. When the value k reaches the maximum value $k_{max}$, the process ends (at 534). For a given value of k, p parity bits are generated for the k information bits (at 522). A variable r starts from 1 (at 523), and the interleaver finds the information bits jr in the set Si that contains a total number of |Si| information bits according to (Eq. 2) (at 524). If it is the first parity bit (i.e., r=1) (at 525), a new sequence starts with the first pair including the information bits Dr that corresponds to the parity bit $c_{jr}$ and the parity bit $c_{jr}$ (at 526), otherwise the next pair including the information bits Dr that corresponds to the parity bit $c_{jr}$ and the parity bit $c_{jr}$ is appended to the current sequence (at 527). If the variable r is greater than p (at 528), the sequence is saved temporarily (step 529), otherwise the variable r is incremented (at 532). After the current pair of the information bits Dr and the parity bit $c_{jr}$ is saved, it is checked if the sequence is invariant from the previous one (at 530). If yes, the number of information bits k is incremented (at 533), and the process repeats until the number of information bits k reaches its maximum (at 521). If no, the previous sequence and previous value of k for the range ending with the previous value of k are saved (at 531), and the number of information bits k is incremented (at 533).

Referring to FIG. 5B, the process starts by investigating whether the number d of allowed number of interleavers is fixed (at 501). A variable a is initially set to 1 (at 540) and proceed to the next step. When the value a reaches the number d of allowed number of interleavers, the process ends (at 554). For a given value of a, the maximum value of k within a partition p parity bits $k_{max}(a)$ is found (at 542), and p parity bits for $k_{max}(a)$ information bits are generated (at 543). Next, set of information bits $S_1$ to $S_p$ are found (at 544). A variable r starts from 1 (at 545), and the interleaver finds the information bits jr according to (Eq. 2) (at 546). If it is the first parity bit (i.e., r=1) (at 547), a new sequence starts with the first pair including the information bits Dr that corresponds to the parity bit $c_{jr}$ and the parity bit $c_{jr}$ (at 548), otherwise the next pair including the information bits Dr that corresponds to the parity bit $c_{jr}$ and the parity bit $c_{jr}$ is appended to the current sequence (at 549). If the variable r is greater than p (at 550), the sequence for the range a is saved (step 551), and the variable a is incremented (at 553). Otherwise, the variable r is incremented (at 552), and the process repeats by finding the information bits jr according to (Eq. 2) (at 546).

Figure 6:
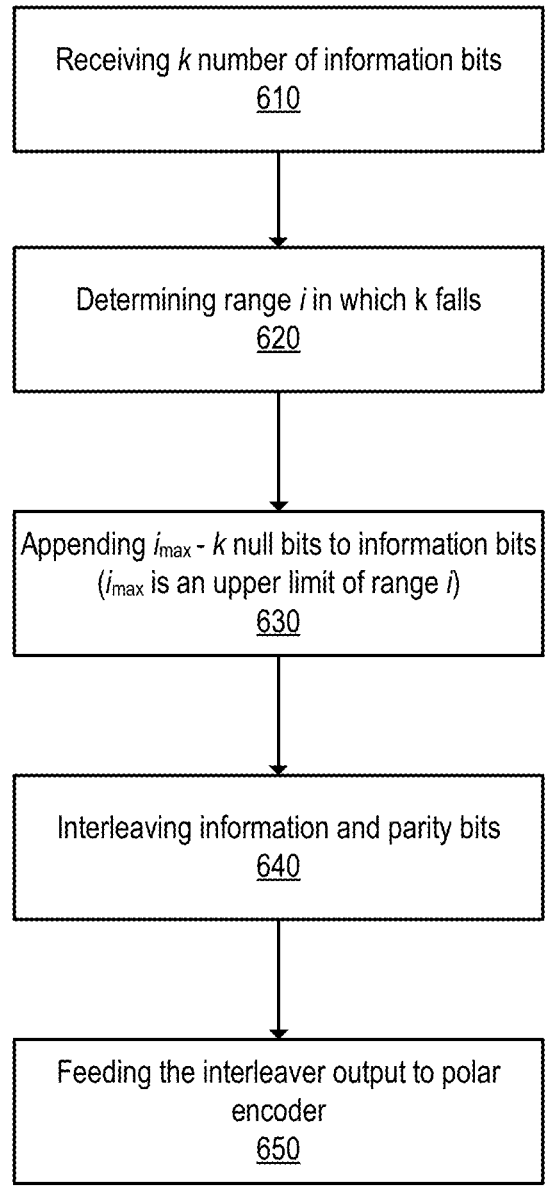
FIG. 6 is a flowchart of an example interleaver selection process according to one embodiment.

FIG. 6 is a flowchart of an example interleaver selection process according to one embodiment. The process starts with receiving k number of information bits (at 610). The first step is to determine a range i in which k falls (at 620). In the second step, $i_{max}$−k null bits are appended to the information bits ($i_{max}$ is an upper limit of range i) (at step 630). In the third step, the interleaver interleaves the information and parity bits (at 640). Finally, the interleaver outputs the interleaved data packet to the polar encoder for encoding (at 650).

Figure 7:
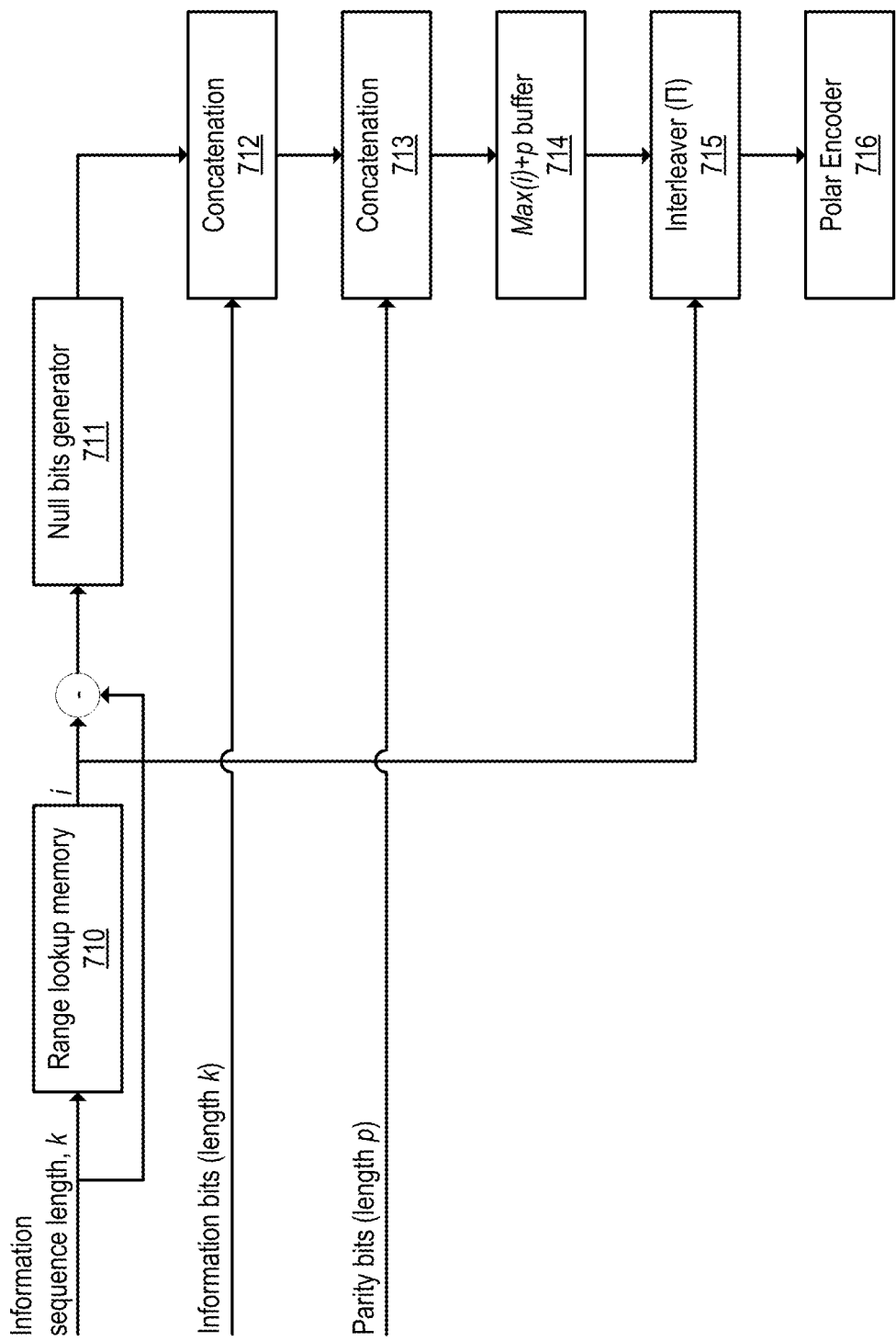
FIG. 7 illustrates an example implementation schematics for the operation of the interleaver according to one embodiment.

From an operational point of view, once the interleavers are designed, the interleaver can be selected as follows. FIG. 7 illustrates an example implementation schematics for the operation of the interleaver according to one embodiment. FIG. 7 shows an implementation scheme for the present interleaving operation.

For a given set of information bits having a length k, the sequence of the information bits is sent to a range lookup memory 710 to determine a range i in which k falls. A null bits generator 711 generates $k_{i+1}$−k null bits. The information bits k are concatenated with the $k_{i+1}$−k null bits (at 712) followed by the concatenation of the corresponding parity bits p (at 713). The maximum value of i and the parity bits are stored in a buffer (714), and the interleaver 715 interleaves the information bits k and the parity bits p. The interleaved sequence is output to a polar encoder 716.

A metric may be used to compare the performance of various interleaving schemes. While the early termination gain that will be described later is defined and used as a performance comparison metric during 3GPP standardization procedure, it is understood that its value has dependency on many parameters such as a channel, a code rate etc. Before looking at the performance comparison with respect to the early termination gain, another metric that is independent of all other parameters except for the CRC polynomial and the number of information bits is considered.

The primary objective of the present interleaver is to locate the information bits as early as possible enabling early termination of decoding when an error occurs. According to one embodiment, the present interleaving scheme can be viewed as minimizing the value of |$D_1$| followed by minimizing |$D_2$| and so on. An example of the metric that can assess such a property is a cumulative sum (CS) metric. The cumulative sum metric can be expressed as follows:

$$CS = \sum_{i=1}^{j_p} \bigcup_{j=1}^{i} |D_j|$$

Figure 8:
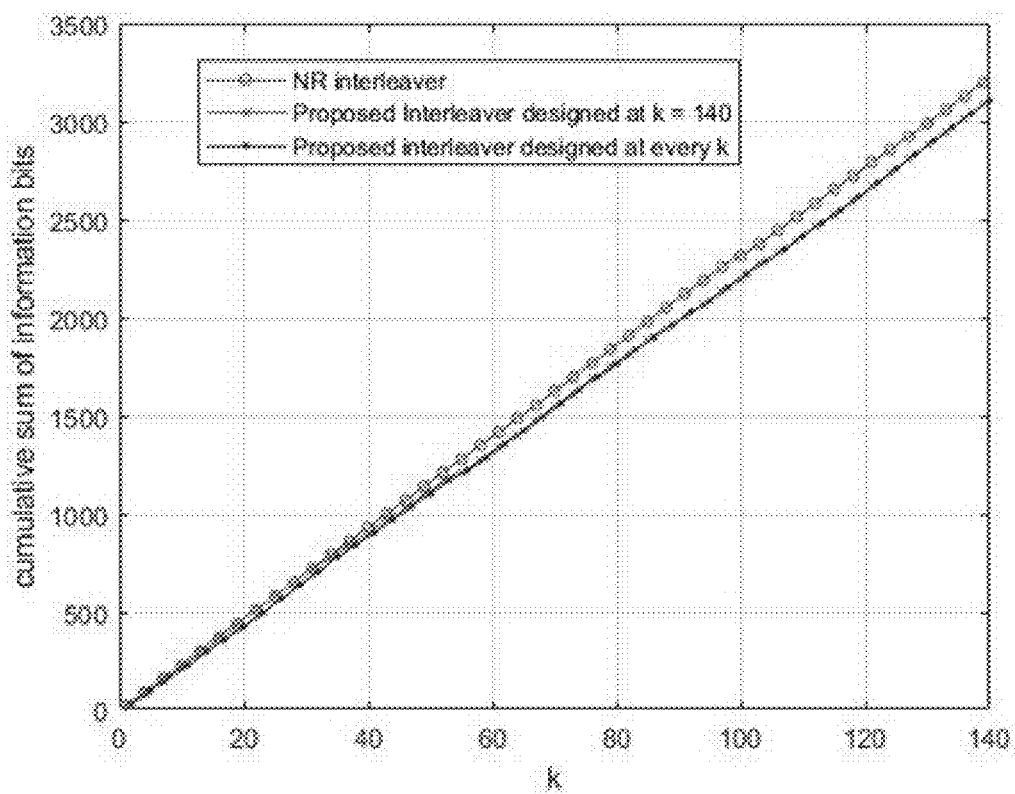
FIG. 8 shows the metric CS for an NR interleaving pattern according to one embodiment.

The interleaver 302 may not necessarily minimize the CS metric; instead, it makes sure that the CS metric is small enough compared to other interleaving patterns. FIG. 8 shows the metric CS for an NR interleaving pattern according to one embodiment. This example shows a comparison result between the specification #38.212 of the 3GPP NR standards and the present interleaving pattern designed at every value of k. FIG. 8 also shows the values of CS for the present interleaving pattern that is designed at k=140 when used for all values of k as explained earlier. FIG. 8 shows that the interleaving pattern that is designed at k=140 is good enough to be used for a wide range of value k while showing better performance than the interleaving pattern of the 3GPP NR standard. It is noted that the value of k is not limited to 140, and it is merely the maximum number of information bits according to the NR specification. Therefore, the same interleaving scheme can apply to any value of k without departing from the scope of the present disclosure.

A performance metric referred to as an early termination gain is used during the 3GPP standardization. The decoding operation affects the early termination gain. For example, under a simplified successive cancellation decoding (SSCL), the decoding complexity and latency of a certain node depends on the type of the node. However, the early termination gain defined as a ratio between the information bits that are not decoded due to early termination divided by the total number of information bits provides a good estimate and comparisons between different interleaving schemes. The early termination gain metric may be used to evaluate the performance of various interleaving schemes associated with a particular polar coding scheme.

FIGS. 9A through 9D illustrates example early termination gains of the present interleaving scheme in comparison with the NR interleaving pattern at different aggregation levels (AL) of PDCCH. Herein, the aggregation level (AL) refers to a number that determines how many control channel elements or resources are allocated for the physical downlink control channel (PDCCH). For example, the allowed aggregation levels in the NR specifications are {1, 2, 4, 8, 16}.

Figure 9A:
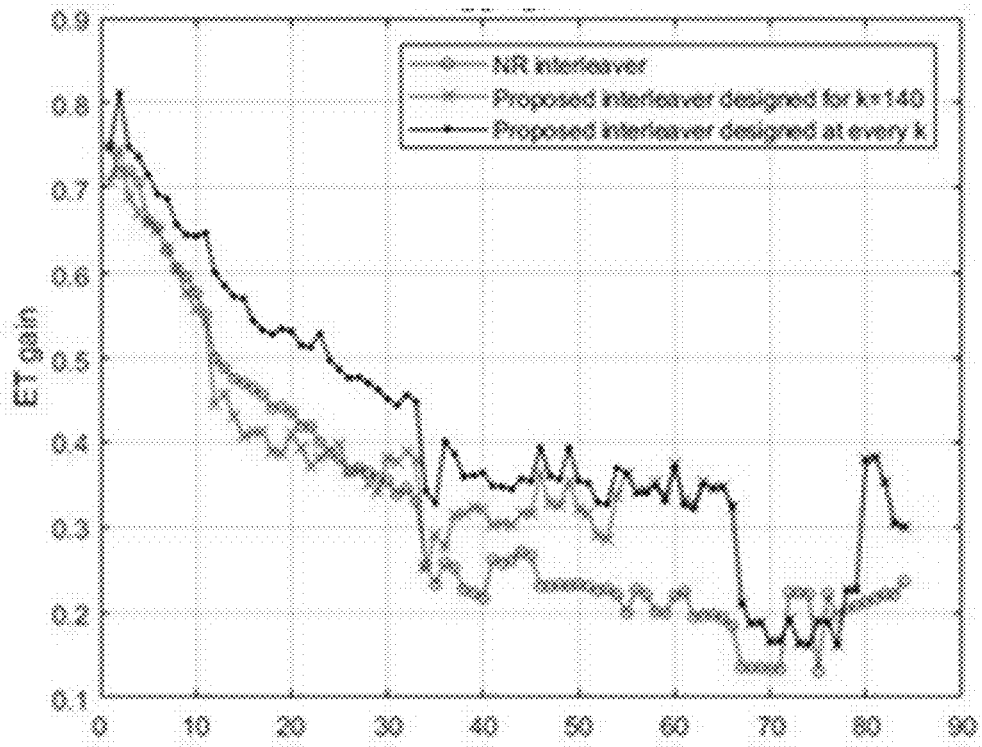
FIGS. 9A through 9D illustrates example early termination gains of the present interleaving scheme in comparison with the NR interleaving pattern at different aggregation levels.
Figure 9B:
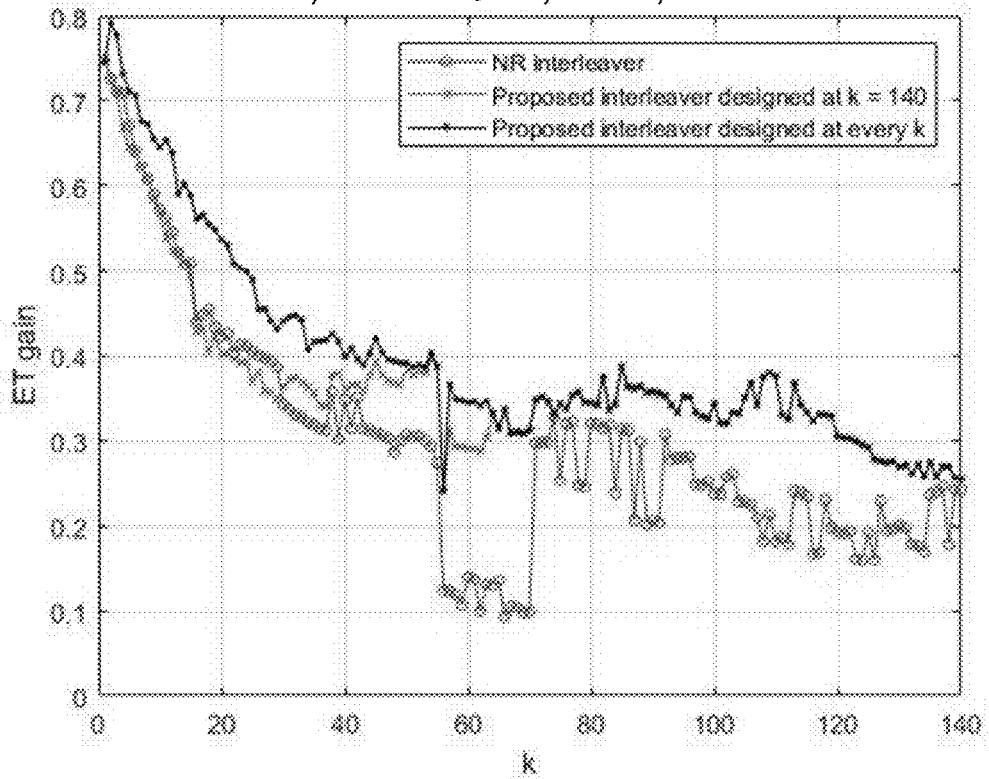
Figure 9C:
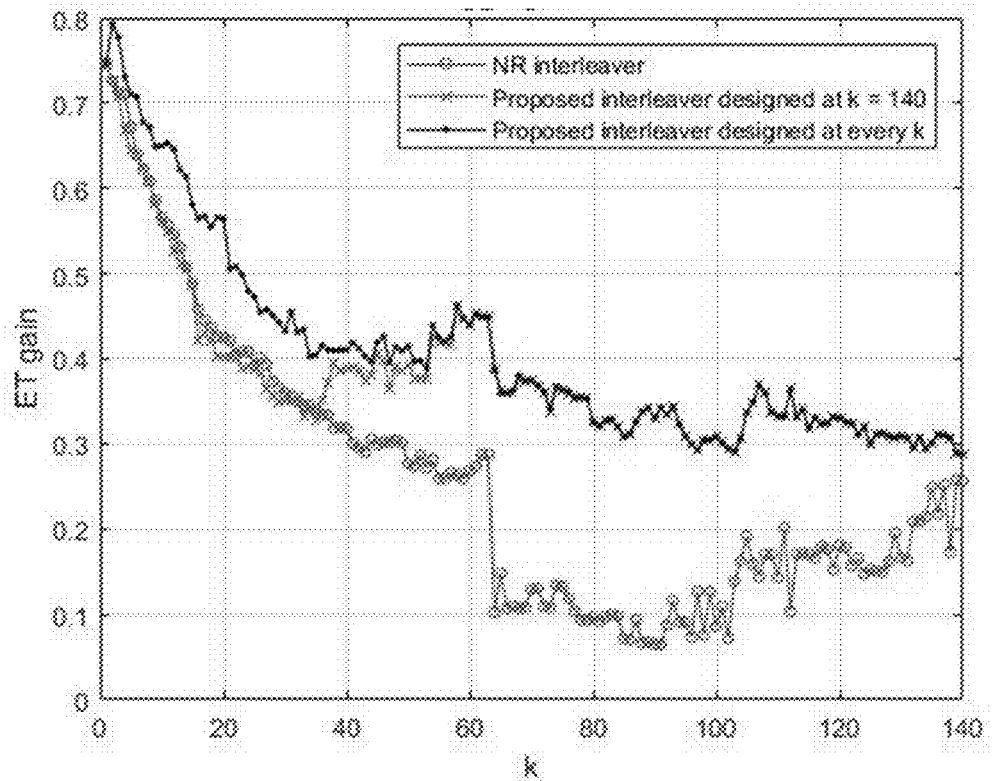
Figure 9D:
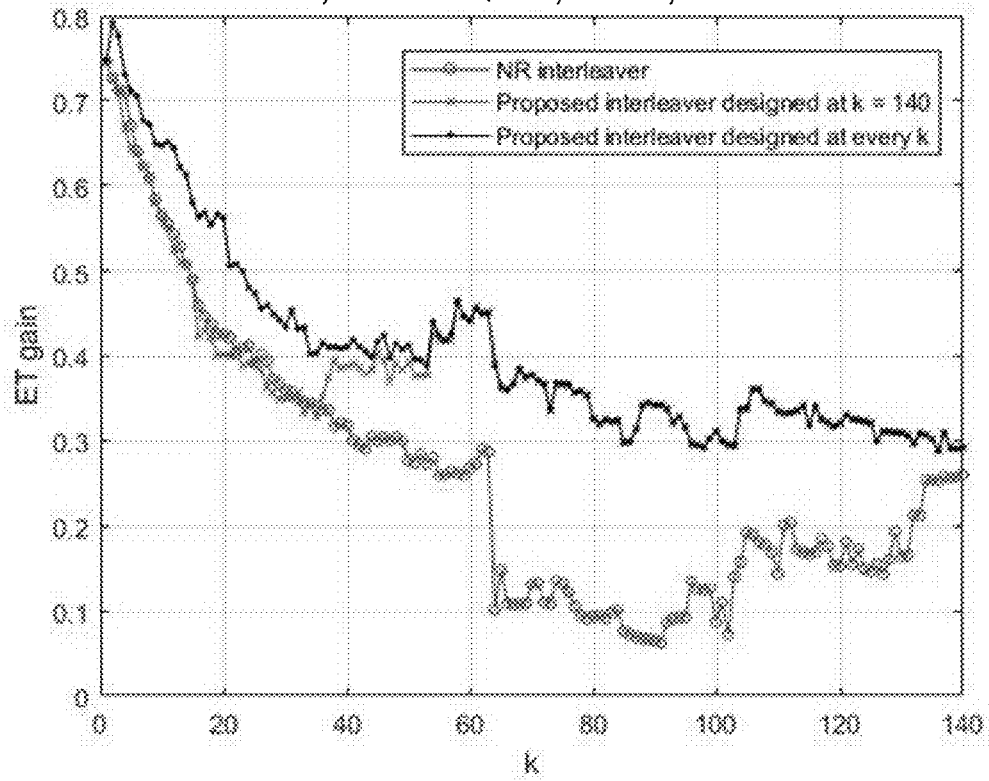

FIGS. 9B through 9D show the early termination gain of the pattern that is designed for k=140. The results shown in FIGS. 9A through 9D are obtained for the Additive White Gaussian Noise (AWGN) channel with the assumption of random Quadrature Phase Shift Keying (QPSK) as an input to the channel. These results show that the present interleaving scheme provides a higher early termination gain than the NR interleaving pattern. These results agree with the observation in FIG. 1 since the one interleaving pattern that is designed at k=140 when used at all values of k gives the same gain of the pattern designed at each k for a wide range of k. The results show that the present interleaver can provide an early termination gain that is 300% higher than the early termination gain of the interleaver used in the NR standard.

Table 1 compares examples of a false alarm (FA) of the present interleaver and the NR-interleaver at different number of information bits k and aggregation levels (AL). These results are obtained under random QPSK input to an AWGN channel. The Signal-To-Noise Ratio (SNR) is adjusted at each pair of (k, AL) such that only 1% of the transmitted blocks under valid downlink control information (DCI) is not correctly decoded. Table 1 shows comparable results of the false alarm rates between the present interleaver and the NR interleaver.

TABLE 1

False alarm rate of the present interleaver versus the NR-interleaver

| (k, AL) | NR-interleaver FA | Present interleaver FA |
|---|---|---|
| (40, 1) | 5.508e−7 | 5.4511e−7 |
| (40, 2) | 5.26e−7 | 5.37e−7 |
| (40, 4) | 4.5058e−7 | 5.15e−7 |
| (40, 8) | 4.17e−7 | 4.37e−7 |
| (70, 1) | 4.91e−7 | 4.905e−7 |
| (70, 2) | 4.88e−7 | 4.61e−7 |
| (70, 4) | 3.71e−7 | 4.138e−7 |

According to one embodiment, an apparatus includes: a cyclic redundancy check (CRC) encoder configured to receive k information bits and generate p parity bits corresponding to the k information bits, k and p being positive integers; and an interleaver configured to output an interleaved bit sequence, in which the k information bits are interleaved with the p parity bits. The interleaved bit sequence includes a first subset of the k information bits appended with a first parity bit of the p parity bits and a second subset of the k information bits appended with a second parity bit of the p parity bits. The first subset of the k information bits is located earlier than the second subset of the k information bits in the interleaved bit sequence. The second subset of the k information bits and all of preceding information bits in the interleaved bit sequence including the first subset of the k information bits deterministically correlate the second parity bit of the p parity bits.

The interleaver may be further configured to: (1) identify a set Si of information bits among the k information bits for each parity bit ci among the p parity bits; and (2) determine a number of bits in the set Si, pi being a parity bit corresponding to the set Si.

The interleaver may be further configured to: (3) determine a set SL having a smallest number of bits among a plurality of sets of the information bits; (4) append the set SL and a parity bit pL that corresponds to the set SL to an intermediate interleaved bit sequence; and (5) remove bits in SL from all other sets Si to generate the interleaved bit sequence.

The interleaver may repeat the steps (3), (4), and (5) for at least p−1 times.

The CRC encoder may generate the p parity bits based on a polynomial CRC code.

The apparatus may be implemented in a base station of a wireless data communication system, and the base station may be configured to send a workload including the interleaved bit sequence to a user equipment of the wireless data communication system over a downlink channel.

The apparatus may further include an encoder configured to encode the interleaved bit sequence.

The apparatus may further include a channel mapper to send the interleaved bit sequence to the user equipment over a channel established by the channel mapper.

According to another embodiment, an apparatus includes: an decoder configured to decode an interleaved bit sequence. The interleaved bit sequence includes a first subset of k information bits appended with a first parity bit of p parity bits and a second subset of the k information bits appended with a second parity bit of the p parity bits. The first subset of the k information bits is located earlier than the second subset of the k information bits in the interleaved bit sequence. The second subset of the k information bits and all of preceding information bits in the interleaved bit sequence including the first subset of the k information bits deterministically correlate the second parity bit of the p parity bits. The decoder is configured to calculate a parity bit corresponding to the first subset of the k information bits and determine an occurrence of a CRC error by comparing the parity bit with the first parity bit of the p parity bits included in the interleaved bit sequence. The decoder is further configured to terminate decoding of the interleave bit sequence when the CRC error is detected.

The apparatus may be implemented in a user equipment of a wireless data communication system, and a base station of the wireless data communication system may be configured to send a workload including the k information bits to the user equipment of the wireless data communication system over a downlink channel.

The p parity bits included in the interleaved bit sequence may be generated by a CRC encoder based on a polynomial CRC code.

The decoder may calculate the parity bit using the polynomial CRC code.

According to another embodiment, a method includes: receiving k information bits, k being a positive integer; generating p parity bits corresponding to the k information bits, p being a positive integer; interleaving the p parity bits in the k information bits to generate an interleaved bit sequence; and transmitting the interleaved bit sequence to a user equipment over a wireless data communication channel. The interleaved bit sequence includes a first subset of the k information bits appended with a first parity bit of the p parity bits and a second subset of the k information bits appended with a second parity bit of the p parity bits. The first subset of the k information bits is located earlier than the second subset of the k information bits in the interleaved bit sequence. The second subset of the k information bits and all of preceding information bits in the interleaved bit sequence including the first subset of the k information bits deterministically correlate the second parity bit of the p parity bits.

The method may further include: (1) identifying a set Si of information bits among the k information bits for each parity bit ci among the p parity bits; and (2) determining a number of bits in the set Si, pi being a parity bit corresponding to the set Si.

The method may further include: (3) determining a set SL having a smallest number of bits among a plurality of sets of the information bits; (4) appending the set SL and a parity bit pL that corresponds to the set SL to an intermediate interleaved bit sequence; and (5) removing bits in SL from all other sets Si to generate the interleaved bit sequence.

The method may further include: repeating the steps (3), (4), and (5) for at least p−1 times.

A CRC encoder may generate the p parity bits based on a polynomial CRC code.

The interleaved bit sequence may be generated by an interleaver implemented in a base station of a wireless data communication system, and the base station may be configured to send a workload including the interleaved bit sequence to a user equipment of the wireless data communication system over a downlink channel.

The method may further include encoding the interleaved bit sequence using a polar encoder.

The method may further include: decoding the interleaved bit sequence; calculating a parity bit corresponding to the first subset of the k information bits; determining an occurrence of a CRC error by comparing the parity bit with the first parity bit of the p parity bits included in the interleaved bit sequence, and terminating decoding of the interleave bit sequence when the CRC error is detected.

The above example embodiments have been described hereinabove to illustrate various embodiments of implementing a system and method for providing a system and method for interleaving distributed cyclic redundancy check (CRC) in polar codes for early termination. Various modifications and departures from the disclosed example embodiments will occur to those having ordinary skill in the art. The subject matter that is intended to be within the scope of the present disclosure is set forth in the following claims.

What is claimed is:
1. An apparatus comprising:
   a cyclic redundancy check (CRC) encoder configured to receive k information bits and generate p parity bits corresponding to the k information bits, k and p being positive integers; and an interleaver configured to output an interleaved bit sequence, in which the k information bits are interleaved with the p parity bits,
wherein the interleaved bit sequence includes a first subset of the k information bits appended with a first parity bit of the p parity bits and a second subset of the k information bits appended with a second parity bit of the p parity bits,
wherein the first subset of the k information bits is located earlier than the second subset of the k information bits in the interleaved bit sequence, and
wherein the second subset of the k information bits and all of preceding information bits in the interleaved bit sequence including the first subset of the k information bits deterministically correlate the second parity bit of the p parity bits.

2. The apparatus of claim 1, wherein the interleaver is further configured to:
(1) identify a set Si of information bits among the k information bits for each parity bit $c_i$ among the p parity bits; and
(2) determine a number of bits in the set Si, pi being a parity bit corresponding to the set Si.

3. The apparatus of claim 2, wherein the interleaver is further configured to:
(3) determine a set SL having a smallest number of bits among a plurality of sets of the information bits;
(4) append the set SL and a parity bit pL that corresponds to the set SL to an intermediate interleaved bit sequence; and
(5) remove bits in SL from all other sets Si to generate the interleaved bit sequence.

4. The apparatus of claim 3, wherein the interleaver repeats the steps (3), (4), and (5) for at least p−1 times.

5. The apparatus of claim 1, wherein the CRC encoder generates the p parity bits based on a polynomial CRC code.

6. The apparatus of claim 1, wherein the apparatus is implemented in a base station of a wireless data communication system, and the base station is configured to send a workload including the interleaved bit sequence to a user equipment of the wireless data communication system over a downlink channel.

7. The apparatus of claim 6, further comprises an encoder configured to encode the interleaved bit sequence.

8. The apparatus of claim 7, further comprises a channel mapper to send the interleaved bit sequence to the user equipment over a channel established by the channel mapper.

9. An apparatus comprising:
a decoder configured to decode an interleaved bit sequence,
wherein the interleaved bit sequence includes a first subset of k information bits appended with a first parity bit of p parity bits and a second subset of the k information bits appended with a second parity bit of the p parity bits,
wherein the first subset of the k information bits is located earlier than the second subset of the k information bits in the interleaved bit sequence,
wherein he second subset of the k information bits and all of preceding information bits in the interleaved bit sequence including the first subset of the k information bits deterministically correlate the second parity bit of the p parity bits,
wherein the decoder is configured to calculate a parity bit corresponding to the first subset of the k information bits and determine an occurrence of a CRC error by comparing the parity bit with the first parity bit of the p parity bits included in the interleaved bit sequence, and
wherein the decoder is further configured to terminate decoding of the interleave bit sequence when the CRC error is detected.

10. The apparatus of claim 9, wherein the apparatus is implemented in a user equipment of a wireless data communication system, and a base station of the wireless data communication system is configured to send a workload including the k information bits to the user equipment of the wireless data communication system over a downlink channel.

11. The apparatus of claim 9, wherein the p parity bits included in the interleaved bit sequence are generated by a CRC encoder based on a polynomial CRC code.

12. The apparatus of claim 11, wherein the decoder calculates the parity bit using the polynomial CRC code.

13. A method comprising:
receiving k information bits, k being a positive integer;
generating p parity bits corresponding to the k information bits, p being a positive integer;
interleaving the p parity bits in the k information bits to generate an interleaved bit sequence; and
transmitting the interleaved bit sequence to a user equipment over a wireless data communication channel,
wherein the interleaved bit sequence includes a first subset of the k information bits appended with a first parity bit of the p parity bits and a second subset of the k information bits appended with a second parity bit of the p parity bits,
wherein the first subset of the k information bits is located earlier than the second subset of the k information bits in the interleaved bit sequence, and
wherein the second subset of the k information bits and all of preceding information bits in the interleaved bit sequence including the first subset of the k information bits deterministically correlate the second parity bit of the p parity bits.

14. The method of claim 13, further comprising:
(1) identifying a set Si of information bits among the k information bits for each parity bit $c_i$ among the p parity bits; and
(2) determining a number of bits in the set Si, pi being a parity bit corresponding to the set Si.

15. The method of claim 14, further comprising:
(3) determining a set SL having a smallest number of bits among a plurality of sets of the information bits;
(4) appending the set SL and a parity bit pL that corresponds to the set SL to an intermediate interleaved bit sequence; and
(5) removing bits in SL from all other sets Si to generate the interleaved bit sequence.

16. The method of claim 15, further comprising:
repeating the steps (3), (4), and (5) for at least p−1 times.

17. The method of claim 13, wherein a CRC encoder generates the p parity bits based on a polynomial CRC code.

18. The method of claim 13, wherein the interleaved bit sequence is generated by an interleaver implemented in a base station of a wireless data communication system, and the base station is configured to send a workload including the interleaved bit sequence to a user equipment of the wireless data communication system over a downlink channel.

19. The method of claim 13, further comprising encoding the interleaved bit sequence using a polar encoder.

20. The method of claim 13, further comprising:
decoding the interleaved bit sequence;
calculating a parity bit corresponding to the first subset of the k information bits;
determining an occurrence of a CRC error by comparing the parity bit with the first parity bit of the p parity bits included in the interleaved bit sequence, and
terminating decoding of the interleave bit sequence when the CRC error is detected.

* * * * *